(12) United States Patent
Khoury et al.

(10) Patent No.: US 8,433,028 B2
(45) Date of Patent: Apr. 30, 2013

(54) LATENCY LOCKED LOOP CIRCUIT FOR DRIVING A BUFFER CIRCUIT

(75) Inventors: John M. Khoury, Austin, TX (US); Eduardo Viegas, Austin, TX (US); Richard Beale, Austin, TX (US)

(73) Assignee: Silicon Laboratories Inc., Austin, TX (US)

( * ) Notice: Subject to any disclaimer, the term of this patent is extended or adjusted under 35 U.S.C. 154(b) by 353 days.

(21) Appl. No.: 12/795,608

(22) Filed: Jun. 7, 2010

(65) Prior Publication Data

US 2011/0298505 A1 Dec. 8, 2011

(51) Int. Cl.
*H03D 3/24* (2006.01)

(52) U.S. Cl.
USPC ............... 375/376; 375/372; 327/156

(58) Field of Classification Search ............... 375/372, 375/376, 377; 327/158, 161; 370/519
See application file for complete search history.

(56) References Cited

U.S. PATENT DOCUMENTS

| | | | |
|---|---|---|---|
| 6,232,833 B1 | 5/2001 | Pullen | |
| 6,771,121 B2 | 8/2004 | Nilsson et al. | |
| 7,078,964 B2 | 7/2006 | Risbo et al. | |
| 7,224,219 B2 | 5/2007 | Spencer | |
| 7,564,981 B2 | 7/2009 | Croft, III | |
| 7,576,606 B2 | 8/2009 | Andersen et al. | |
| 7,605,653 B2 | 10/2009 | Kozak et al. | |
| 7,612,608 B2 | 11/2009 | Kozak et al. | |
| 7,629,840 B2 | 12/2009 | Midya et al. | |
| 2002/0046288 A1 | 4/2002 | Mantegna et al. | |
| 2002/0057119 A1* | 5/2002 | Stubbs et al. | 327/158 |
| 2003/0219088 A1* | 11/2003 | Kwak | 375/376 |
| 2004/0251936 A1* | 12/2004 | Gomm | 327/141 |
| 2006/0087354 A1* | 4/2006 | Minzoni | 327/158 |
| 2006/0103458 A1 | 5/2006 | Hansen et al. | |
| 2006/0267636 A1* | 11/2006 | Lin | 327/3 |
| 2007/0116109 A1 | 5/2007 | Stanley | |
| 2007/0205817 A1* | 9/2007 | Gomm et al. | 327/158 |
| 2007/0220184 A1* | 9/2007 | Tierno | 710/52 |
| 2008/0192876 A1 | 8/2008 | Dulger et al. | |
| 2008/0297218 A1 | 12/2008 | Greenberg et al. | |
| 2009/0153205 A1* | 6/2009 | Johnson | 327/158 |
| 2009/0289708 A1 | 11/2009 | Beale et al. | |
| 2010/0054350 A1 | 3/2010 | Kojima | |

* cited by examiner

*Primary Examiner* — Jean B Corrielus
(74) *Attorney, Agent, or Firm* — Cesari & Reed LLP; R. Michael Reed

(57) ABSTRACT

In an embodiment, a circuit includes a buffer circuit including a buffer input and an output terminal and a latency locked loop (LLL) circuit. The LLL circuit includes a signal input for receiving an input signal, a feedback input coupled to the output terminal, and a signal output coupled to the buffer input. The LLL circuit is configured to control a propagation delay between the signal input and the signal output to produce a substantially constant total delay from the signal input to the output terminal.

28 Claims, 4 Drawing Sheets

LATENCY LOCKED LOOP CIRCUIT FOR DRIVING A BUFFER CIRCUIT

FIELD

The present disclosure is generally related to buffer circuits, and more particularly to a latency locked loop circuit for driving a buffer circuit.

BACKGROUND

Pulse width modulation (PWM) systems are used to generate analog signals from digital data. PWM signals can be used to drive an H-bridge or similar device (such as an amplifier or other buffer circuit) to achieve high power and high efficiency amplification. An ideal H-bridge is simply a buffer that reproduces the digital waveforms with higher output amplitude. Preferably, the buffer has a fixed delay, providing edge transitions (rising or falling) at its output at a fixed time offset from the input.

Unfortunately, the propagation delay of a practical H-bridge implementation may be variable and/or signal dependent. In Class D amplifiers, such as those used in audio applications, propagation delay variations through an H-bridge or buffer circuit represents a non-linearity. Such a non-linearity can result in degraded Total Harmonic Distortion of the audio signal. If spectral energy spreading techniques have been applied to the PWM signal, such a non-linearity can cause high frequency noise to fold into the lower frequencies of the audio band or the band of interest, resulting in harmonic distortion or degraded signal-to-noise ratio (SNR).

SUMMARY

In one embodiment, a circuit includes a buffer circuit having a buffer input and a buffer output and includes a latency locked loop (LLL) circuit. The LLL circuit includes a signal input for receiving an input signal, a feedback input coupled to the output terminal of the buffer, and a signal output coupled to the buffer input. The LLL circuit is configured to control a propagation delay between the signal input and the buffer output to produce a substantially constant total delay from the signal input to the buffer output.

In another embodiment, a device includes a load circuit, a buffer circuit, and a latency locked loop (LLL) circuit. The buffer circuit includes a buffer input and a buffer output that is coupled to the load circuit. The LLL circuit includes an LLL input for receiving a first pulse width modulated (PWM) signal, a feedback input coupled to the buffer output, and an LLL output terminal coupled to the buffer input. The LLL circuit is configured to control pulse widths and pulse positions of pulses within an output signal on the output terminal by controlling a propagation delay of individual edge transitions of the first PWM signal.

In yet another embodiment, a circuit includes an H-bridge comprising first and second inputs and first and second outputs and includes a latency locked loop (LLL) circuit. The LLL circuit includes first and second LLL inputs configurable to receive first and second pulse width modulated (PWM) signal, respectively. The LLL circuit further including a first LLL output coupled to the first input of the H-bridge and a second LLL output coupled to the second input of the H-bridge. The LLL circuit is configured to automatically control a first variable delay associated with the first LLL input and a second variable delay associated with the second LLL input to provide a substantially constant total propagation delay from the first and second LLL inputs to the first and second outputs of the H-bridge for individual edge transitions within the first and second PWM signals.

In still another embodiment, a circuit includes an H-bridge including an input and including an output configurable to provide a pulse width modulated (PWM) output signal to a load circuit. The circuit further includes a latency locked loop (LLL) circuit including an LLL input for receiving a PWM input signal and including an LLL output coupled to the input of the H-bridge. The LLL circuit is configured to measure pulse widths of the PWM output signal and to adjust edge timing of the PWM input signal at the input of the H-bridge to ensure that pulse widths of the PWM output signal are substantially equal to pulse widths of the PWM input signal.

BRIEF DESCRIPTION OF THE DRAWINGS

In the following description, the use of the same reference numerals in different drawings indicates similar or identical items.

DETAILED DESCRIPTION OF ILLUSTRATIVE EMBODIMENTS

A latency locked loop circuit is disclosed below that uses feedback to eliminate propagation delay variations of an H-bridge type driver, ensuring that the net propagation delay through the H-bridge is substantially constant. In particular, the feedback is used to adjust a variable delay to offset propagation delay variations through the H-bridge, keeping the delay substantially constant and thus the H-bridge is linearized. Further, the data rate of the signal is not changed. In a particular example, the latency locked loop circuit uses timing feedback around the H-bridge to provide timing edge placement at the output of the H-bridge that is signal independent, while retaining the content of the original signal.

Before discussing the latency locked loop circuit in detail, it is important to understand how an H-bridge introduces propagation delay variations into the output waveform. A representative example of such a circuit is described below with respect to FIG. 1.

In the following discussion, the term "connected" is used to refer to both direct connections and indirect connections between components. It should be understood that, within the illustrated embodiments, additional circuit elements and parasitic components (not shown) may exist within the circuitry, and that the illustrated connections may include such elements and/or parasitic components. Accordingly, the term "connected" as used herein includes direct connections as well as indirect couplings.

Figure 1:
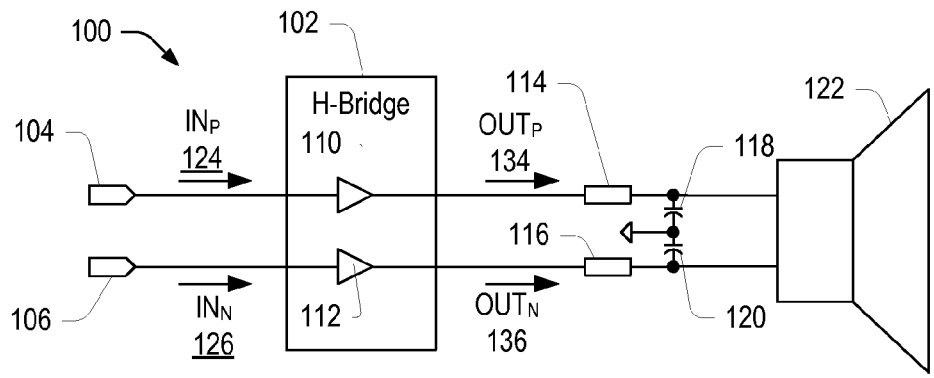
FIG. 1 is a partial block diagram and partial schematic diagram of a circuit including a conventional H-bridge driver circuit.

FIG. 1 is a diagram of a circuit 100 including a conventional H-bridge driver circuit 102 with a load including a speaker 122. H-bridge 102 includes two half H-bridges, including half H-bridge 110 and a half H-bridge 112. Circuit 100 further includes inputs 104 and 106 and outputs connected to a speaker 122 through an inductive/capacitive load represented by inductors 114 and 116 and capacitors 118 and 120.

In operation, first and second input signals (i.e., a positive input signal ($IN_P$) 124 and a negative input signal ($IN_N$) 126) are applied to inputs 104 and 106. The first and second input signals can be pulse-width modulated (PWM) signals. Alternatively, the first and second input signals can be other types of differentially encoded digital signals. H-bridge 102 amplifies (and delays) pulses within the signals to produce corresponding positive output signal ($OUT_P$) 134 and negative output signal ($OUT_N$) 136. Propagation delays within output signals 134 and 136 may vary based, in part, on the size of transistors used within H-bridge 102 and on the load current provided to the load circuitry, represented by speaker 122 and the inductive-capacitive connection, represented by inductors 114 and 116 and by capacitors 118 and 120.

In general, inductors 114 and 116 "store" an average current that follows the audio signal content contained within input signals 124 and 126. Superimposed on this average current is a high frequency sawtooth ripple current due to the switching. For example, for a maximum single-ended output swing of 6.6V, the average inductor current could be as high as 1.0 ampere with a sawtooth ripple current of plus or minus 50 mA, depending on the switching frequency. As the audio signal level changes, the average currents stored in the inductors 114 and 116 also change, and these current levels can either help or impede signal propagation through the H-bridge 102. Further, in complementary metal oxide semiconductor (CMOS) implementations, parasitic effects, such as the body effect, can impact threshold voltages and other parameters of the MOS devices, contributing to variations in the propagation delays.

Figure 2:
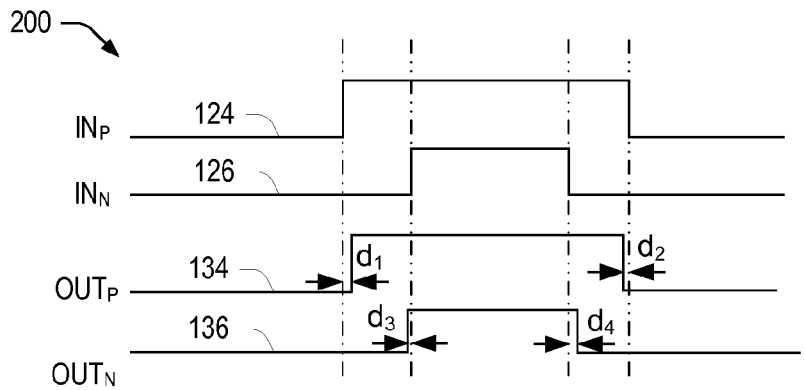
FIG. 2 is a timing diagram depicting differential input and output signals of the H-bridge of FIG. 1 for positive output signals.
Figure 3:
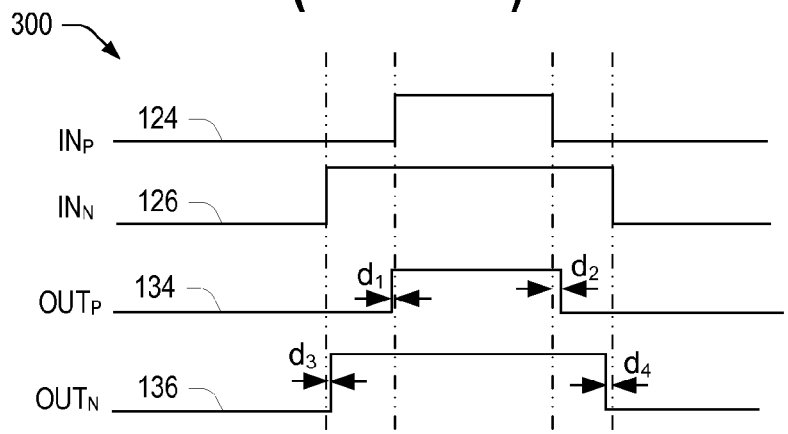
FIG. 3 is a timing diagram depicting differential input and output signals of the H-bridge of FIG. 1 for negative output signals.

Such propagation delays may vary according to the particular transition edge. In particular, rising edge transitions may have a different propagation delay than that of falling edge transitions. For differential signals where the content of interest is contained in the difference between the signals, such propagation delays can lead to distortion of the content. FIGS. 2 and 3 below depict an example where the timing of the output waveforms of output signals 134 and 136 does not match that of the input waveforms of input signals 124 and 126.

FIG. 2 is a timing diagram 200 depicting differential input and output signals ($OUT_P$ and $OUT_N$) 134 and 136 of the H-bridge 102 of FIG. 1 for positive output signals. In this example, the fixed portion of the propagation delay from H-bridge 102 has been removed. As shown, rising edge transitions of the positive input ($IN_P$) 124 are delayed within the positive output ($OUT_P$) 134 by a first offset delay ($d_1$) that is different from the second offset delay ($d_2$) associated with the falling edge transition of the positive output ($OUT_P$) 134 relative to the corresponding falling edge of the positive input ($IN_P$) 124. Further, the rising edge transitions of the negative input ($IN_N$) 126 are delayed within the negative output ($OUT_N$) 136 by a third offset delay ($d_3$) that is different from the fourth offset delay (d4) associated with the falling edge transition of the negative output ($OUT_N$) 136.

It should be understood that the offset delays ($d_1$, $d_2$, $d_3$, and $d_4$) can be different from one another. Such delay variation between rising and falling edges contributes a nonlinearity that reduces the signal-to-noise-plus-distortion ratio (SNDR) of the output signal.

FIG. 3 is a timing diagram 300 depicting differential input and output signals ($OUT_P$ and $OUT_N$) 134 and 136 of the H-bridge 102 of FIG. 1 for negative output signals. In this instance, the edge transitions ($d_1$, $d_2$, $d_3$, and $d_4$) in the output signals 134 and 136 again vary from their corresponding input signals 124 and 126; however, the variations are different from those associated with the positive output signals in FIG. 2.

Such variations represent four possible propagation delay modes: rise transition, fall transition, positive load current, and negative load current. An illustrative example of a representative propagation delay versus load current for a rising edge transition and for a falling edge transition is described below with respect to FIG. 4.

Figure 4:
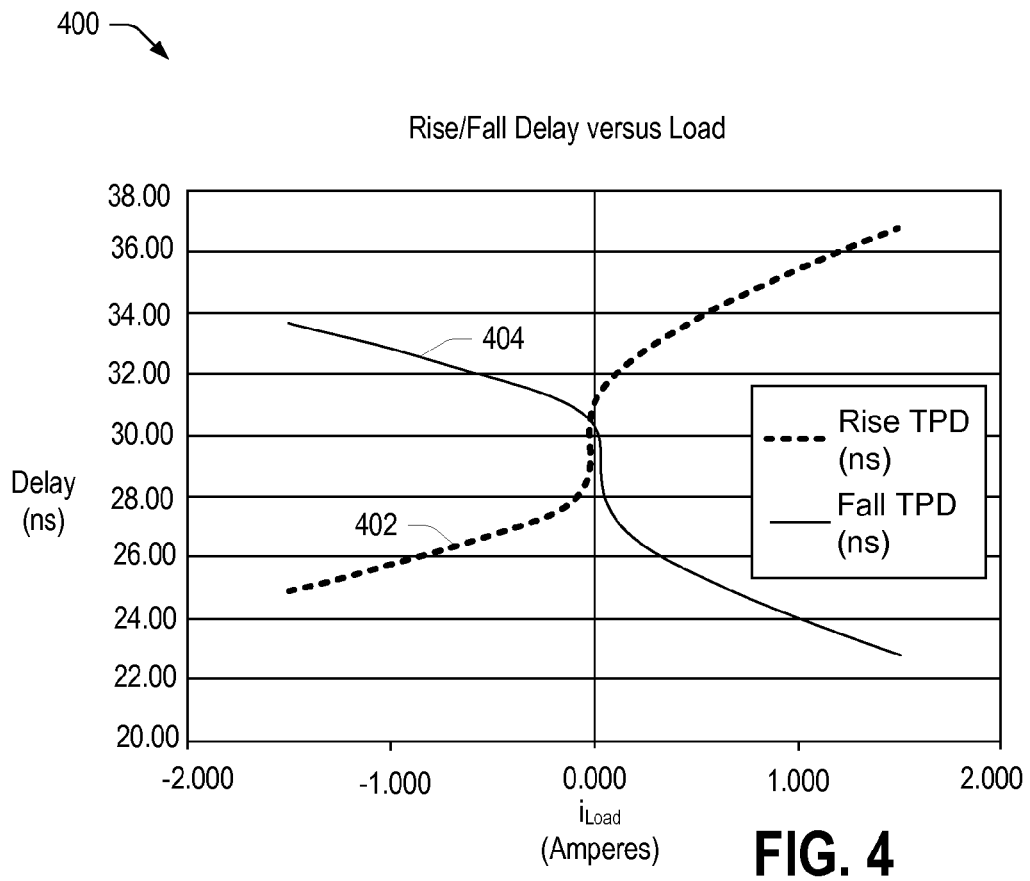
FIG. 4 is a graph of propagation delay as a function of the load current for rising and falling edges of a signal through the H-bridge of FIG. 1.

FIG. 4 is a graph 400 of propagation delay as a function of the load current for rising and falling edges of a signal through H-bridge 102 of FIG. 1. Within graph 400, the horizontal axis represents load current in amperes and the vertical axis represents the delay in nanoseconds. Graph 400 shows a delay for a rising edge transition 402 and a delay for a falling edge transition 404 as a function of the load current. Unfortunately, the rising and falling edge transitions 402 and 404 do not have odd or even symmetry, so propagation delays through the H-bridge 102 do not cancel. Thus, the propagation error should be corrected and controlled, which correction may include managing up to four independent states.

To better understand the source of the variable propagation delays, it should be understood that buffer circuits, such as H-bridges, often use fairly large transistor devices, which may have large gate-to-source capacitances. Such gate-to-source capacitances introduce delays in switching in response to transitions within the input signal. One possible model of the conventional H-bridge that takes into account the delay in switching is described below with respect to FIG. 5.

Figure 5:
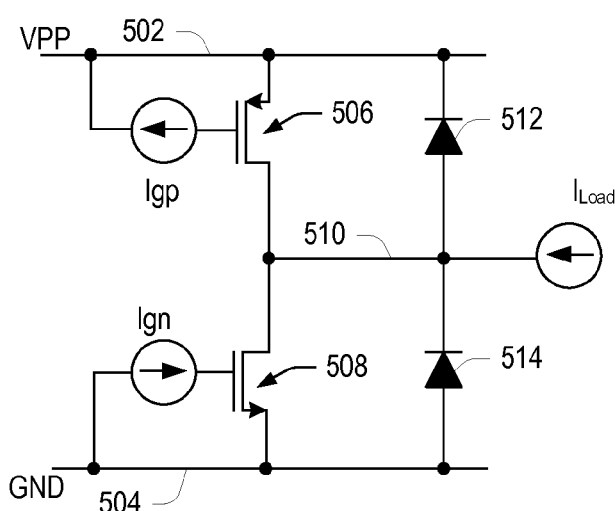
FIG. 5 is a diagram of a simplified model of a conventional H-bridge, such as the H-bridge depicted in FIG. 1.

FIG. 5 is a diagram of a representative model of a conventional H-bridge 500, such as the H-bridge 102 depicted in FIG. 1. H-bridge 500 includes supply terminals 502 and 504, which may be positive and ground terminals. Additionally, H-bridge 500 includes a PMOS transistor 506, an NMOS transistor 508, an output terminal 510, and diodes 512 and 514. PMOS transistor 506 has a source connected to supply terminal 502, a gate connected to supply terminal 502 through a gate current source (Igp) and a drain connected to output terminal 510. NMOS transistor 508 includes a drain connected to output terminal 510, a gate connected to supply terminal 504 through a gate current source (Ign), and a source connected to supply terminal 504. Diode 514 includes an anode connected to supply terminal 504 and a cathode connected to the output terminal 510. Diode 512 includes an anode connected to the output terminal 510 and a cathode connected to the supply terminal 502. The output terminal 510 is connected to an output current source ($I_{Load}$).

The output current source ($I_{Load}$) is used to represent the current "stored" in the load inductor. The NMOS and PMOS transistors 508 and 506, respectively, are turned on and off with pre-drivers that are represented as current sources (Ign and Igp). In most Class D amplifiers, the output transistors are very large, resulting in extremely large gate to source capacitances; therefore, the gate-to-source (Vgs) voltages cannot be changed quickly, so the pre-drivers can be modeled as current sources (Ign and Igp). Assuming that the load current ($I_{Load}$) is positive and assuming that the NMOS transistor 508 should be turned on to pull the output voltage on output terminal 510 to zero, the square law model of the transistor drain current can be calculated according to Equation 1 below:

$$I = K[V_{gs} - V_T]^2 \qquad (1)$$

In Equation 1, the variable (K) is a constant, the variable ($V_T$) is the threshold voltage, and the variable ($V_{gs}$) is the gate-to-source voltage. The gate capacitance of the NMOS transistor 508 is charged up to a level of Vgs that can sink the load current ($I_{Load}$). Larger load currents require the Vgs to be raised to a higher level, which requires more time to charge based on current supplied by the current pre-driver (assuming the current pre-driver supplies a substantially constant current). Thus, within the model, propagation time increases with larger load currents, which is consistent with real implementations. The propagation delay ($\tau_P$) can be estimated according to Equation 2 below:

$$\tau_p = \frac{C_{gsn}}{I_{gn}} \left[ V_T + \sqrt{\frac{I_{Load}}{K}} \right] \qquad (2)$$

In Equation 2, the variable ($C_{gsn}$) is the gate-to-source capacitance of NMOS transistor 508. It should be understood that Equation 2 is valid for positive load currents and does not take into account the turning off of the PMOS transistor 506. However, Equation 2 nevertheless does confirm that larger load currents lead to increased propagation times ($T_p$).

If the load current ($I_{Load}$) is negative, the output voltage will decrease to ground as soon as the PMOS transistor 506 turns off, independent of the state of NMOS transistor 508 because the load current ($I_{Load}$) is pulled through the protection diode 514, which is connected to supply terminal 504 (i.e., to ground).

In the context of PWM signals, all desired audio information is contained in the edges of the PWM signal. At the output of the H-bridge 500, if the placement of edge transitions is signal dependent (i.e. load current dependent), then a nonlinearity results. Such signal dependent propagation delay causes harmonic distortion of the low frequency signal content at the output of the H-bridge 500. Since a PWM signal has high frequency components, it is possible that high frequency out-of-band energy (noise or distortion) can be folded into the lower frequency audio passband due to the nonlinearities.

Embodiments of a latency locked loop circuit described below with respect to FIGS. 6 and 7 can be used to dynamically adjust the propagation delay to provide a substantially constant total propagation delay from the inputs to the outputs of the circuit by controlling timing for rising and falling edge transitions independent of the input waveform and independent of the load current. An example of a latency lock loop circuit is described below with respect to FIG. 6 that uses a timing feedback from the output of the H-bridge to dynamically adjust timing edge placement at the input of the H-bridge, producing an output signal having a substantially constant propagation delay that is signal and load current independent.

Figure 6:
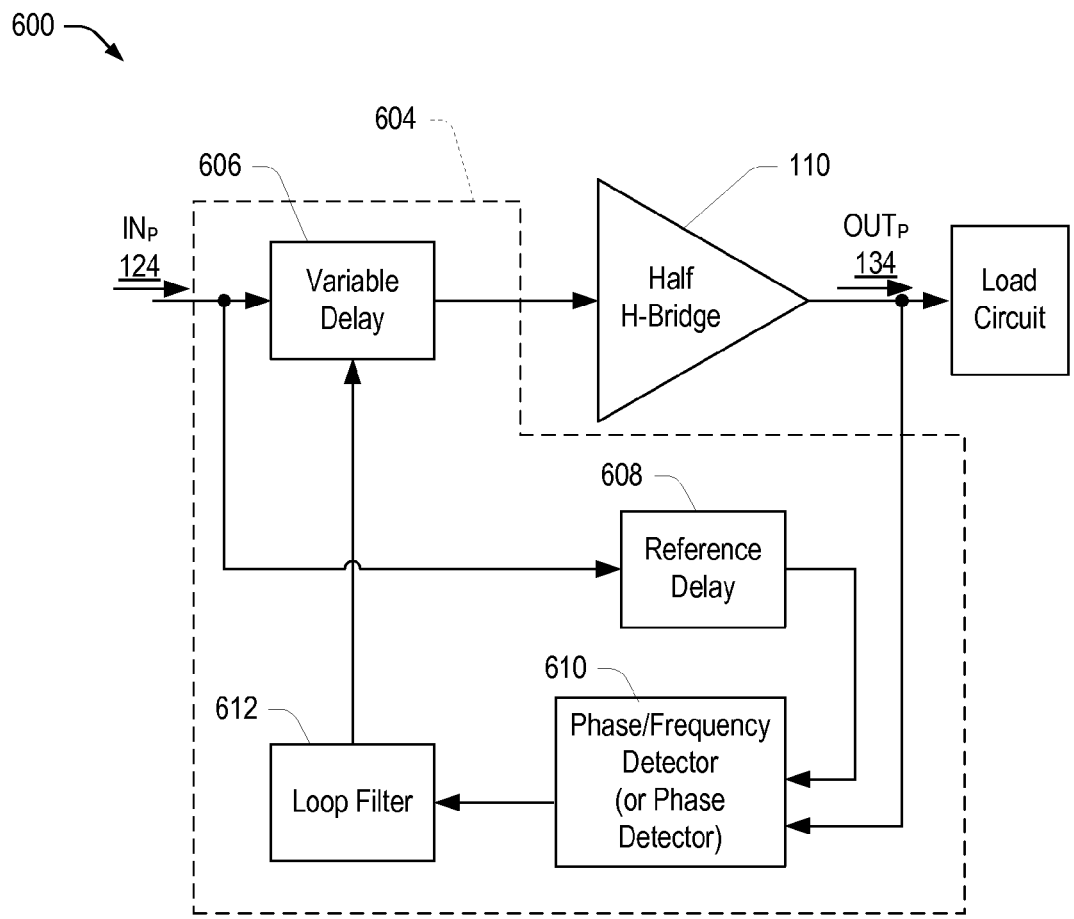
FIG. 6 is a block diagram of a circuit including half-of the H-bridge and including a latency lock loop circuit.

FIG. 6 is a block diagram of a circuit 600 including half H-bridge 110 and including a latency lock loop (LLL) circuit 604. LLL circuit 604 includes a variable delay circuit 606 having an input for receiving an input signal (such positive input signal ($IN_P$) 124) and an output connected to an input of half H-bridge 110. Variable delay circuit 606 also includes a control input for receiving an adjustment signal from loop filter 612. LLL circuit 604 further includes a reference delay circuit 608 including an input for receiving positive input signal ($IN_P$) 124 and an output connected to a first input of a phase/frequency detector (PFD) 610. PFD 610 includes a second input connected to an output terminal of half H-bridge 110 for receiving edge transitions of positive output signal ($OUT_P$) 134 and includes an output connected to loop filter 612. While in the illustrated embodiment, PFD 610 is shown, it should be understood that other types of phase detectors may also be used.

In the illustrated embodiment of FIG. 6, it is assumed, for simplicity, that the rising and falling edges of the half H-bridge 110 have the same delay variation with a given load current. The input signal ($IN_P$) 124 is applied both to variable delay circuit 606 and to reference delay circuit 608 simultaneously. Reference delay circuit 608 has a fixed delay that is independent of the input signal ($IN_P$) 124.

In operation, the input signal propagates through the cascade of variable delay circuit 606 and half H-bridge 110 and, ideally, the total delay through the variable delay circuit 606 and the half H-bridge 110 is substantially equal to the reference delay through the reference delay circuit 608. PFD 610 compares the edges of the output signal ($OUT_P$) 134 at the output of half H-bridge 110 to the edges of the signal from the reference delay circuit 608, and provides a phase error signal to loop filter 612. Loop filter 612 generates an adjustment signal to adjust variable delay circuit 606 to control the delay of the transitions within the input signal, which are subsequently provided to half H-bridge 110. PFD 610 and loop filter 612 cooperate to adjust the variable delay of variable delay circuit 606 until the total propagation delay matches the delay provided by reference delay circuit 608, without substantially altering the data rate (or frame rate) of the signal.

In one particular embodiment, loop filter 612 can be a first order filter, such as an integrator, for basic operation. The first order filter may be a lossy integrator or a lossless filter. In other embodiments, loop filter 612 can be a higher order filter (i.e., second order or higher order) for enhanced in-band attenuation, particularly at low frequencies. Such a higher order filter may be any passive or active filter known in the art. Further, loop filter 612 may store a history of edge transitions. Loop filter 612 can be digital or analog. In an embodiment, loop filter 612 can be digital and can be adapted to provide an analog interpolation that is provided to variable delay circuit 606 to adjust the variable delay. Such analog interpolation may be used to apply particular variable delays in response to repeated patterns within the input signal, for example.

In the illustrated embodiment, LLL circuit 604 controls pulse widths by controlling the edge transition position within a PWM frame at the output of the half H-bridge 110 by controlling the propagation delay of individual edges of the PWM input signal 124 at the input of the half H-bridge 110. In some instances, the propagation delay of rising edges may be significantly different from that of falling edges. Further, propagation delay of negative pulses may be different from that of positive pulses. In such instances, in may be desirable to independently control each of the transitions.

In a particular embodiment, one or more loop filters, such as loop filter 612, may be used to store a history of phase errors/edge placement errors for each type of edge. In such an instance, the edge placement errors may be averaged, combined, interpolated, or otherwise processed to produce a variable delay adjustment signal. In one instance, the phase errors of the individual edges may be linearly combined to produce a corrective adjustment for variable delay circuit 606. In an embodiment, the circuit may include eight independent loop filters including a first set of four loop filters and a second set of four loop filters. Each loop filter of the first set of four loop filters may be configured to control a delay associated with one of a rising edge transition and a falling edge transition of one of the first and second PWM signals. Each loop filter of the second set of four loop filters may be configured to control a delay associated with one of a rising edge transition and a falling edge transition of inverted and interchanged versions of the first and second PWM signals. Depending on the implementation, the control signal provided by loop filter 612 to variable delay circuit 606 may be based on a weighted summation of the phase errors, an average, or other factors.

In the illustrated embodiment, one or more of reference delay circuit 606, reference delay 608, PFD 610, and loop filter 612 can be implemented as digital components. For example, reference delay 608 can be formed using a plurality of inverters. Reference delay circuit 606 can be formed using a series of gated inverters, which can be selectively bypassed to produce a desired delay.

It should be understood that the output signal 134 has substantially the same pulse widths as input signal 124, with a fixed propagation delay (i.e., timing offset). However, output signal 134 and input signal 124 have substantially the same frequency, data rate, frame rate, and so on. While the amplitude of the output signal 134 may vary from that of the input signal 124, the pulse widths and other characteristics of the signals are substantially the same.

In the illustrated embodiment, LLL circuit 604 is configured to provide edge adjustments for rising edges of an input signal, such as a positive PWM signal of a differential signal pair. However, the loop filter 612, PFD 610, variable delay circuit 606, and reference delay circuit 608 may be duplicated with the addition of some inverters and a slicer to provide edge transition adjustments for falling edges of the input signal. Further, the circuit may be duplicated to provide edge adjustments for rising and falling edges of a second input signal, such as the negative PWM signal of the differential signal pair. An example of a circuit configured to independently control output edge transitions for rising and falling edges of two input signals is described below with respect to FIG. 7.

Figure 7:
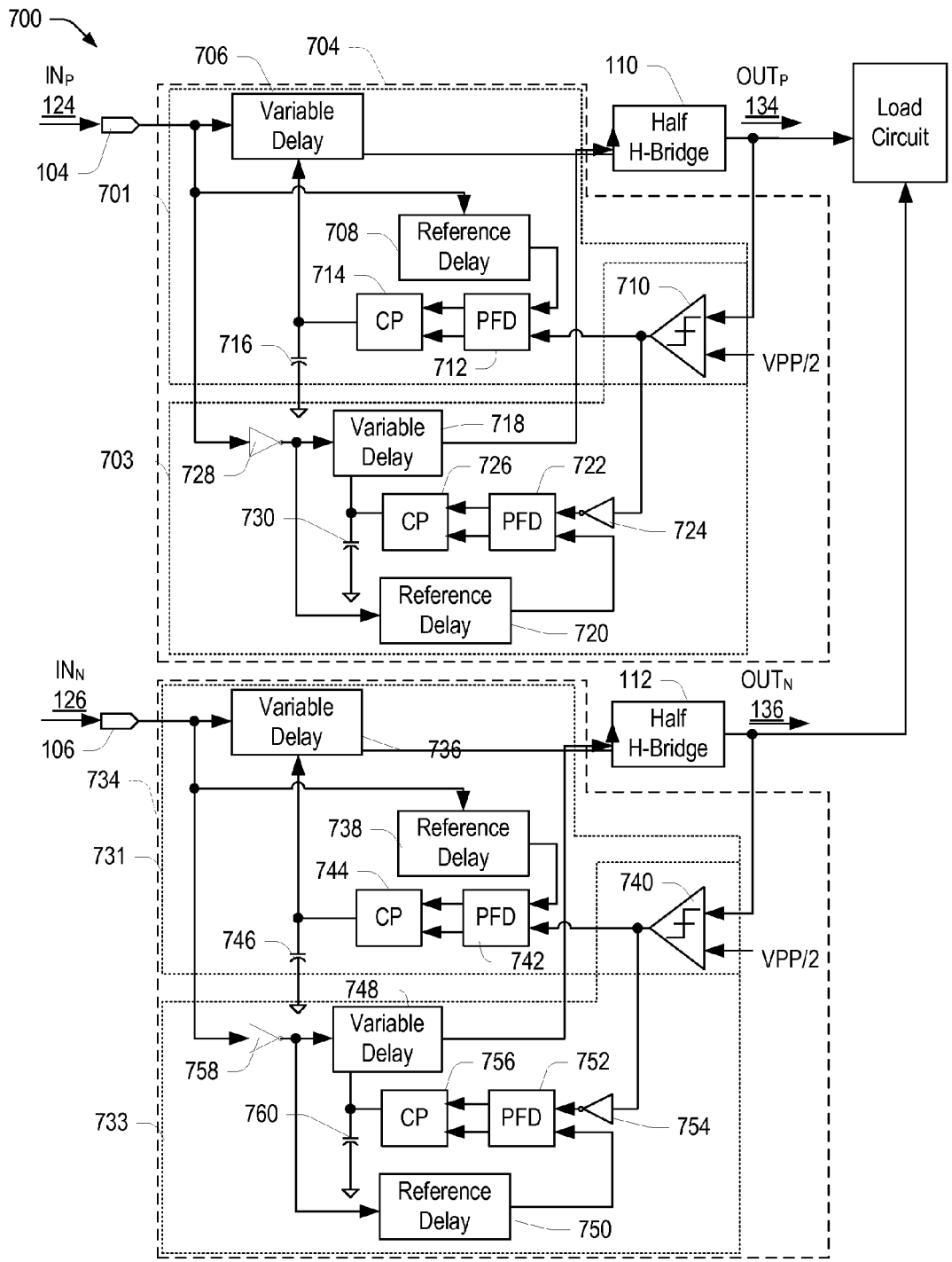
FIG. 7 is a block diagram of a circuit including LLL circuitry for independently adjusting propagation delays for both rising and falling edges of input signals for a full H-bridge circuit.

FIG. 7 is a block diagram of a circuit 700 including LLL circuitry 704 and 734 for independently adjusting propagation delays for both rising and falling edges of input signals. LLL circuitry 704 and 734 includes four independent feedback loops 701, 703, 731, and 733 configured to cancel the load current dependent propagation delay of the H-bridge 102 (represented by half H-bridges 110 and 112). A first LLL circuit 704 includes first and second feedback loops 701 and 703 for adjusting propagation delays of rising and falling edge transitions of first input signal 124. A second LLL circuit 734 includes third and fourth feedback loops 731 and 733 for adjusting propagation delays of rising and falling edge transitions of second input signal 126. While the first and second LLL circuits 704 and 734 are depicted as separate circuits, it should be understood that, at least in some embodiments, the circuits 704 and 734 represent first and second signal processing portions of a single LLL circuit.

First feedback loop 701 includes a variable delay circuit 706, a reference delay circuit 708, a slicer 710, a phase/frequency detector (PFD) 712, a charge pump 714, and a capacitor 716. The charge pump 714 and capacitor 716 represent loop filter 612 in FIG. 6. Second feedback loop 703 includes a slicer 710, a variable delay circuit 718, a reference delay circuit 720, a PFD 722, a charge pump 726, a capacitor 730, and inverters 724 and 728. Variable delay circuit 706 includes a delay input connected to input 104 for receiving input signal (IN$_P$) 124, a delay control input connected to PFD 712 through charge pump 714 and to ground through capacitor 716, and a delay output connected to half H-bridge 110. Reference delay circuit 708 includes a reference input connected to pin 104 for receiving input signal (IN$_P$) 124 and a reference output connected to an input of PFD 712. Slicer 710 includes an input connected to an output of half H-bridge 110 for receiving output signal (OUT$_P$) 134, a second input for receiving a voltage signal (which may be a reference voltage that is approximately half of a peak-to-peak voltage swing between a first logic level and a second logic level of the output signal (OUT$_P$) 134 (i.e., V$_{PP}$/2), and an output connected to a second input of PFD 712. PFD 712 detects phase differences between transitions from the reference-delayed version of input signal 124 from reference delay circuit 708 and the total-propagation-delayed version of input signal 124 represented by output signal (OUT$_P$) 134 received from slicer 710. PFD 712 communicates phase error data to charge pump 714, which produces an output signal that controls the variable delay of variable delay circuit 706 to adjust rising edge transition timing for a next rising edge within input signal (IN$_P$) 124.

Second feedback loop 703 includes a slicer 710, a variable delay circuit 718, a reference delay circuit 720, a PFD 722, a charge pump 726, a capacitor 730, and inverters 724 and 728. Second feedback loop 703 operates in the same manner as first feedback loop 701, except that the input signal (IN$_P$) 124 is inverted by inverter 728 and the sliced version of the output signal from slicer 710 is inverted by inverter 724. Thus, second feedback loop 703 operates on the falling edge transitions within input signal (IN$_P$) 104 and variably delays falling edge transitions from input signal (IN$_P$) 124 and provides them to half H-bridge 110.

Third feedback loop 731 includes a variable delay circuit 736, a reference delay circuit 738, a slicer 740, a PFD 742, a charge pump 744, and a capacitor 746. Fourth feedback loop 733 includes a variable delay circuit 748, a reference delay circuit 750, a PFD circuit 752, a charge pump 756, slicer 740, a capacitor 760, and inverters 754 and 758. Third and fourth feedback loops 731 and 733 operate in the same manner as first and second feedback loops 701 and 703, except that the third and fourth feedback loops 731 and 733 operate on the second input signal (IN$_N$) 126 received from pin 106 and provide the variably delayed version of the second input signal (IN$_N$) 126 to half H-bridge 112. Further, third and fourth feedback loops 731 and 733 adjust the variable delays of variable delay circuits 736 and 748 based on the output signal (OUT$_N$) 136.

In operation, feedback loops 701 and 731 are adapted to adjust timing of edge transitions for the rising edge transitions of the positive input (IN$_P$) signal and the negative input signal (IN$_N$), respectively. Feedback loops 703 and 733 are adapted to adjust timing of edge transitions for the falling edge transitions of the positive input (IN$_P$) and the negative input (IN$_N$) signal, respectively. Feedback loops 701, 703, 731, and 733 are independent of one another and cooperate to cancel the load current dependent propagation delay of the H-bridge circuit (represented by half H-bridges 110 and 112).

In the illustrated embodiment of FIG. 7, it is assumed that variable delay circuits 706, 718, 736, and 748; reference delay circuits 708, 720, 738, and 750; and PFD circuits 712, 722, 742, and 752 are configured to respond to rising edge transitions. Accordingly, inverters 724, 728, 754, and 758 are included to capture the effect of the falling edge transitions.

In a particular example, differential input signals are received, such as differentially modulated PWM signals, including a first signal at positive input (IN$_P$) 104 and a second signal at negative input (IN$_N$) 106. The first signal is provided to variable delay circuit 706 and to reference delay circuit 708 within first feedback loop 701 and to variable delay circuit 718 and reference delay circuit 720 via inverter 728 within second feedback loop 703. The second signal is provided to variable delay circuit 736 and reference delay circuit 738 within third feedback loop 731 and to variable delay circuit 748 and reference delay circuit 750 via inverter 758 within fourth feedback loop 733. Variable delay circuits 706 and 736 apply respective variable delays to the rising edge transitions of the first and second input signals and provide the variably delayed signals to the respective half H-bridges 110 and 112, which introduce their own delays, which may be both signal and load current dependent. Variable delay circuits 718 and 748 apply respective variable delays to falling edge transitions of the first and second input signals and provide the variably delayed signals to the respective half H-bridges 110 and 112, which introduce their own delays, which may be both signal and load current dependent.

Slicers 710 and 740 capture the edge transitions of positive output signal (OUT$_P$) 134 on a first output terminal and of negative output signal (OUT$_N$) 136 on a second output terminal, which edge transitions are provided to PFD circuits 712 and 742 and which are provided to PFDs 722 and 752 through inverters 724 and 754, respectively. Reference delay circuits 708 and 720 apply fixed delays to input signal 124, and reference delay circuits 738 and 750 apply fixed delays to input signal 126. The delays applied by reference delay circuits 708, 720, 738, and 750 may be programmed to be greater than the estimated delay introduced by the circuitry of the H-bridge circuit 102.

PFDs 712, 722, 742 and 752 compare the reference delayed edge transitions with the sampled edge transitions from slicers 710 and 740 to determine a phase error for each of the transition edges. PFDs 712, 722, 742 and 752 generate phase error signals, which after filtering are provided to variable delay circuits 706, 718, 736, and 748, to adjust the variable delay such that the overall delay from inputs 104 and 106 to the outputs of half H-bridges 110 and 112 are substantially equal to the reference delays provided by reference delay circuits 708, 720, 738, and 750. In a particular embodiment, the resulting overall delay through the circuit is substantially constant for rising edges and falling edges, independent of the load current of any load circuitry connected to the H-bridge 102.

In the illustrated embodiment, PFDs 712, 722, 742, and 752 are depicted as phase/frequency detectors; however, other types of phase detectors may be used. Further, it should be understood that, in some embodiments, variable delay circuits 706, 718, 736, and 748, reference delay circuits 708, 720, 738, and 750, PFDs 712, 722, 742, and 752 may be implemented as digital components.

While a conventional delay lock loop acquires and typically settles into a relatively static condition, the LLL circuitry 704 and 734 continuously tracks propagation delay variation of the H-bridge 102 and adjusts the variable delay of variable delay circuits 706, 718, 736, and 748 to cancel out propagation delay variations. Since delay variations of the H-bridge 102 are signal dependent, the variable delay adjustment control signal from the PFDs 712, 722, 742, and 752, after filtering by charge pumps 714, 726, 744, and 756 and capacitors 716, 730, 746, and 760, has distorted signal content, which pre-distorts and effectively cancels the distortion in the output signals (OUT$_P$ and OUT$_N$) 134 and 136.

In a particular example, LLL circuitry 704 and 734 was used to drive audio signals into a speaker (i.e, the load circuit). In this example, the LLL circuitry 704 and 734 reduced total harmonic distortion of the H-bridge 102 driving audio signals into the speaker from 45 dB to over 70 dB. Depending on the frequency band of interest and depending on the filters used, the LLL circuitry 704 and 734 can be used to cancel load current dependent and signal content dependent propagation delays to produce a substantially constant propagation delay from input to output, linearizing the circuit.

In the illustrated embodiment of FIG. 7, LLL circuitry 704 and 734 adjusts timing of edge transitions at the input of the half H-bridges 110 and 112, based on delays measured in the output signals 134 and 136 so that the output signals 134 and 136 are substantially the same as the inputs signals 114 and 116 in terms of data rate, pulse widths, frequency, and so on. Thus, the total propagation delay from inputs 104 and 106 to the outputs of half H-bridges 110 and 112 remains substantially constant, independent of the content of the input signal and independent of the load current.

In conjunction with the circuits 600 and 700 depicted in FIGS. 6 and 7 and described above, a latency locked loop circuit is disclosed that uses feedback to substantially eliminate propagation delay variation of a buffer circuit, such as an H-bridge type of driver circuit. The LLL circuitry adjusts a variable delay at an input to the buffer circuit to control a total propagation delay, such that the total propagation delay remains substantially constant, independent of the input signal and the load current. Thus, LLL circuitry can be incorporated into a driver of a buffer circuit to linearize the buffer circuit performance and to reduce total harmonic distortion and prevents the folding of high frequency PWM components into the desired signal band, improviding the overall signal-to-noise-plus-distortion ratio (SNDR).

Although the inventive subject matter has been described with reference to preferred embodiments, workers skilled in the art will recognize that changes may be made in form and detail without departing from the scope of the invention.

The invention claimed is:

1. A circuit comprising:
a buffer circuit including a buffer input and an output terminal; and
a latency locked loop (LLL) circuit including a signal input for receiving an input signal, a feedback input coupled to the output terminal, and a signal output coupled to the buffer input, the LLL circuit configured to control a propagation delay between the signal input and the signal output to produce a substantially constant total delay from the signal input to the output terminal.

2. The circuit of claim 1, wherein the LLL circuit is configured to:
measure pulse widths of an output signal on the output terminal;
compare the pulse widths of the output signal to pulse widths of the input signal on the signal input; and
adjust timing of edge transitions within the input signal on the signal input to control the pulse widths of the output signal.

3. The circuit of claim 1, wherein the LLL circuit controls timing of pulse edge transitions of the input signal to produce an output signal having an output data rate that is substantially equal to a data rate of the input signal and having a fixed delay relative to the input signal.

4. The circuit of claim 1, wherein the LLL circuit comprises:
a reference delay circuit including a reference input coupled to the signal input and a reference output for carrying a delay signal having edge transitions with a fixed timing offset relative to edge transitions within the input signal;

a phase detector including a first input coupled to the reference output, a second input coupled to the output terminal, and a detector output for providing a phase error signal;

a loop filter including an input coupled to the detector output and including a filter output; and a variable delay circuit including a delay input coupled to the signal input, a delay control input coupled to the filter output, and a delay output coupled to the buffer input.

5. The circuit of claim 4, wherein the loop filter is configured to produce a delay adjustment signal based on the phase error signal; and wherein the variable delay circuit is responsive to the delay adjustment signal to adjust the propagation delay from the LLL input to the output terminal such that the substantially constant total delay is approximately equal to the fixed timing offset.

6. The circuit of claim 4, wherein the loop filter is configured to store independent state variables representing phase error signals for rising edge transitions and for falling edge transitions within an output signal on the output terminal.

7. The circuit of claim 4, wherein the loop filter provides a delay adjustment signal to the variable delay circuit, the delay adjustment signal comprising a linear combination of stored phase errors for rising edge transitions and falling edge transitions within an output signal on the output terminal.

8. The circuit of claim 4, wherein the loop filter is configured to interpolate a plurality of phase error signals for at least one of rising edge transitions and falling edge transitions to produce the delay adjustment signal.

9. The circuit of claim 1, wherein the LLL circuit is configured to independently control the propagation delay of rising edge transitions and falling edge transitions of the input signal to produce an output signal having a substantially fixed propagation delay relative to the input signal.

10. The circuit of claim 1, wherein the buffer circuit comprises an H-bridge circuit; and wherein the LLL circuit independently controls the propagation delay of rising edge transitions and falling edge transitions propagating through respective halves of the H-bridge circuit.

11. The circuit of claim 1, wherein the input signal comprises a two-level digital signal.

12. The circuit of claim 1, wherein the input signal is a one-bit sigma-delta modulated bit stream.

13. A device comprising:
a load circuit;
a buffer circuit including a buffer input and including a buffer output coupled to the load circuit; and
a latency locked loop (LLL) circuit including an LLL input for receiving a first pulse width modulated (PWM) signal, a feedback input coupled to the buffer output, and an LLL output terminal coupled to the buffer input, the LLL circuit configured to control pulse widths and pulse positions of pulses within an output signal on the output terminal by controlling a propagation delay of individual edge transitions of the first PWM signal.

14. The device of claim 13, wherein the buffer circuit comprises an H-bridge circuit.

15. The device of claim 13, further comprising:
wherein the buffer circuit further includes a second buffer input and includes a second buffer output coupled to the load circuit; and
wherein the LLL circuit includes a second LLL input for receiving a second PWM signal, a second feedback input coupled to the second buffer output, and a second LLL output terminal coupled to the second buffer input, the LLL circuit configured to control pulse widths and pulse positions of pulses within a second output signal on the second buffer output by controlling a second propagation delay of individual edge transitions of the second PWM signal.

16. The device of claim 15, wherein the LLL circuit is configured to independently control rising edge transitions and falling edge transitions of the first and second PWM signals.

17. The device of claim 13, wherein the LLL circuit comprises:
a first variable delay circuit including the LLL input, a control input, and an LLL output coupled to the buffer input;
a second variable delay circuit the second LLL input, a control input, and an LLL output coupled to the second buffer input; and
at least one loop filter configured coupled to the control inputs of the first and second variable delay circuits, the at least one loop filter configured to provide first and second delay adjustment signals to the first and second variable delay circuits, respectively, to control the propagation delay and the second propagation delay.

18. The device of claim 17, wherein the at least one loop filter comprises four independent feedback loop filters comprising:
a first loop filter configured to control a first delay associated with rising edge transitions of the first PWM signal;
a second loop filter configured to control a second delay associated with falling edge transitions of the first PWM signal;
a third loop filter configured to control a third delay associated with rising edge transitions of the second PWM signal; and
a fourth loop filter configured to control a fourth delay associated with falling edge transitions of the second PWM signal.

19. The device of claim 17, wherein the at least one loop filter comprises first and second sets of independent feedback loop filters, and wherein comprising:
each loop filter of the first set of loop filters is configured to control a delay associated with one of a rising edge transition and a falling edge transition of one of the first and second PWM signals; and
each loop filter of the second set of loop filters is configured to control a delay associated with one of a rising edge transition and a falling edge transition of inverted and interchanged versions of the first and second PWM signals.

20. A circuit comprising:
an H-bridge comprising first and second inputs and first and second outputs; and
a latency locked loop (LLL) circuit including first and second LLL inputs configurable to receive first and second pulse width modulated (PWM) signal, respectively, the LLL circuit further including a first LLL output coupled to the first input of the H-bridge and a second LLL output coupled to the second input of the H-bridge, the LLL circuit configured to automatically control a first variable delay associated with the first LLL input and a second variable delay associated with the second LLL input to provide a substantially constant total propagation delay from the first and second LLL inputs to the first and second outputs of the H-bridge for individual edge transitions within the first and second PWM signals.

21. The circuit of claim 20, wherein the LLL circuit is a digital circuit.

22. The circuit of claim 20, wherein the LLL circuit comprises:
a first reference delay circuit including a first reference input coupled to the first LLL input and a reference output for carrying a delayed version of the first PWM signal having edge transitions with a fixed timing offset;
a first phase detector including a first input coupled to the reference output, a second input coupled to the first output of the H-bridge, and a detector output for providing a phase error signal;
a loop filter including a filter input coupled to the detector output and a filter output; and
at least one variable delay circuit including a delay input coupled to the first LLL input, a control input coupled to the filter output for receiving a delay adjustment signal related to the phase error signal, and an output coupled to the first input of the H-bridge.

23. The circuit of claim 22, wherein the reference delay circuit, the phase detector, the loop filter, and the variable delay circuit are digital circuits.

24. The circuit of claim 22, wherein the loop filter is implemented in firmware.

25. The circuit of claim 22, wherein the reference delay circuit, the phase detector, the loop filter, and the variable delay circuit are analog circuits.

26. A circuit comprising:
an H-bridge including an input and including an output configurable to provide a pulse width modulated (PWM) output signal to a load circuit; and
a latency locked loop (LLL) circuit including an LLL input for receiving a PWM input signal and including an LLL output coupled to the input of the H-bridge, the LLL circuit configured to measure pulse widths of the PWM output signal and to adjust edge timing of the PWM input signal at the input of the H-bridge to ensure that pulse widths of the PWM output signal are substantially equal to pulse widths of the PWM input signal.

27. The circuit of claim 26, wherein the PWM output signal has a data rate that is approximately equal to a data rate of the PWM input signal.

28. The circuit of claim 26, wherein the PWM output signal has a frequency that is approximately equal to a frequency of the PWM input signal.

* * * * *